United States Patent [19]
Den Braber

[11] Patent Number: 5,440,586
[45] Date of Patent: Aug. 8, 1995

[54] RECEIVER HAVING REDUCED INFLUENCE OF OSCILLATOR RADIATION AND PARASITIC CROSSTALK EFFECTS ON GAIN CONTROL

[75] Inventor: Gerard P. Den Braber, Eindhoven, Netherlands

[73] Assignee: U.S. Philips Corporation, New York, N.Y.

[21] Appl. No.: 221,557

[22] Filed: Mar. 31, 1994

Related U.S. Application Data

[63] Continuation of Ser. No. 909,239, Jul. 6, 1992, abandoned.

[30] Foreign Application Priority Data

Jul. 15, 1991 [EP] European Pat. Off. ............ 91201848

[51] Int. Cl.⁶ .......................... H03D 3/18; H03D 3/24
[52] U.S. Cl. ...................... 375/327; 455/45; 455/260; 455/237.1; 381/2
[58] Field of Search .............. 375/81, 80, 97, 78, 375/118, 119, 120, 82; 455/45, 260, 237.1, 205, 208, 255–259; 381/2, 10, 15

[56] References Cited

U.S. PATENT DOCUMENTS 5,093,930 3/1992 Kasperkovitz ................ 455/237.1

FOREIGN PATENT DOCUMENTS 0371548 11/1988 European Pat. Off. ...... H03D 1/22

Primary Examiner—Stephen Chin
Assistant Examiner—Hai H. Phan
Attorney, Agent, or Firm—Edward W. Goodman

[57] ABSTRACT

Receiver having an RF input for applying an RF input carrier thereto, which receiver is coupled to a phase-locked loop (PLL) whose signal path incorporates a phase detector, a loop filter, a controlled amplifier and a controlled oscillator, and a signal generator for generating a local auxiliary pilot and a pilot detector for detecting the local auxiliary pilot, a first input of which is coupled to the signal path of the PLL between an output of the phase detector and a control input of the controlled oscillator, a second input is coupled to an output of the signal generator and an output is coupled to a control input of the controlled amplifier via a selection device. To reduce the influence of oscillator radiation and other parasitic crosstalk effects on the gain control, the output of the signal generator in the receiver is coupled to the signal path between an output of the phase detector and the control input of the controlled oscillator for an angle modulation of the oscillator signal with the auxiliary pilot.

15 Claims, 1 Drawing Sheet

RECEIVER HAVING REDUCED INFLUENCE OF OSCILLATOR RADIATION AND PARASITIC CROSSTALK EFFECTS ON GAIN CONTROL

This is a continuation of application Ser. No. 07/909,239, filed Jul. 9, 1992, abandoned.

BACKGROUND OF THE INVENTION

1. Field of the Invention

The invention relates to a receiver having an RF input for applying an RF input carrier thereto, which is coupled to a phase-locked loop (PLL) having a signal path incorporating a phase detector, a loop filter, a controlled amplifier and a controlled oscillator, and a signal generator for generating a local auxiliary pilot and a pilot detector for detecting the local auxiliary pilot, the pilot detector having a first input coupled to the signal path of the phase-locked loop between an output of the phase detector and a control input of the controlled oscillator, a second input coupled to an output of the signal generator, and an output coupled to a control input of the controlled amplifier via a selection device.

2. Description of the Related Art

A receiver of this type is known per se, for example, from European Patent Application no. 89 20 29 62, (corresponding to U.S. Pat. No. 5,093,930).

The known receiver is a directly mixing AM PLL synchronous receiver in which a synchronous detector is used for a synchronous amplitude detection of a modulation signal which is amplitude-modulated on the RF input carrier. The local mixing carrier required for this synchronous detection is obtained by means of the controlled oscillator incorporated in the phase-locked loop and should be phase-synchronous with the RF input carrier for a correct synchronous detection. The local mixing career is therefore also referred to as the local in-phase carrier. An accurate phase equality between the RF input carder and the local in-phase carrier is obtained if the local quadrature carrier supplied by the controlled oscillator to the phase detector differs accurately 90° in phase from the RF input carrier.

As is known, the phase detector supplies a phase difference signal which in practice does not only depend on the phase difference deviating from 90° between the RF input carrier and the local quadrature carrier, but also on the amplitude or field strength of the RF input carrier. To prevent the loop transfer properties, such as the gain, bandwidth, phase shift and stability of the loop, from varying with the amplitude of the RF input carrier, an automatic control of the loop gain is realized in the known AM PLL synchronous receiver. The control signal required for this automatic control is obtained by means of a mixer stage in which the RF input carrier is mixed with a local in-phase carrier which is amplitude-modulated with the auxiliary pilot. A desired mixing product is then obtained whose frequency corresponds to that of the auxiliary pilot and whose amplitude varies with that of the RF input carrier. After a low-pass selection of this desired mixing product, a conversion or demodulation of this mixing product with the original auxiliary pilot is effected in the pilot detector, which results in a dc signal varying with the field strength variations of the RF input carrier, this de signal being subsequently applied as a gain control signal to the control input of the controlled amplifier.

However, due to oscillator radiation and other effects of parasitic crosstalk, the unmodulated local carriers supplied by the controlled oscillator occur with a crosstalk-dependent amplitude at the RF input of the receiver. These parasitic oscillator signals are multiplied in the last-mentioned mixer stage by the local in-phase carrier of the controlled oscillator, amplitude-modulated with the auxiliary pilot, resulting in a parasitic mixing product having a frequency which is equal to that of the auxiliary pilot. This parasitic mixing product is superimposed on and passes, together with the desired mixing product, the low-pass selection and gives rise to a parasitic dc offset of the gain control signal at the output of the pilot detector. This parasitic dc offset of the gain control signal increases with the frequency of the oscillator signal. Consequently, the automatic gain control is disturbed to an extent increasing with the frequency, which results in a reduction, increasing with the frequency, of the dynamic range of the receiver.

Moreover, phase errors between the local careers regenerated with the controlled oscillator and the RF input carrier, due to, for example, spreads in the free running frequency of the controlled oscillator, varying ambient factors such as ageing and temperature variations, do not affect the gain control signal of said known receiver. Therefore, the variations in the loop transfer due to these phase errors, hereinafter also referred to as slowly varying or static phase errors, are not compensated for by the known gain control circuit.

SUMMARY OF THE INVENTION

It is an object of the invention to provide a receiver which meets these drawbacks and is suitable for receiving RF AM and/or RF FM reception signals.

According to the invention, a receiver of the type described in the opening paragraph is therefore characterized in that the output of the signal generator is coupled to the signal path between an output of the phase detector and the control input of the controlled oscillator for an angle modulation of the oscillator signal with the auxiliary pilot.

The invention is based on the recognition that it is possible to compensate not only for variations in the loop transfer due to amplitude variations of the RF input carrier but also, for example, those which occur as a result of the above-mentioned static phase errors by means of a gain control using a gain control signal which is derived from the amplitude and phase variations to which an auxiliary pilot in the PLL injected at a correct point in the signal path of the PLL is subjected. Moreover, such a gain control signal does not vary or varies at least substantially less with the frequency of the RF input carrier than a gain control using a gain control signal which is directly derived from the amplitude variations of the PLL input signal.

When the measure according to the invention is used, the auxiliary pilot is injected in the PLL at an injection point of the signal path between an output of the phase detector and the control input of the controlled oscillator and is detected at a detection point of the signal path between the output of the phase detector and the control input of the controlled oscillator. The auxiliary pilot injected at the injection point will hereinafter be referred to as the original pilot, and the auxiliary pilot which is produced at the detection point by this original pilot will be referred to as the return pilot.

Viewed in the signal direction, the injection point may precede or follow the detection point. The controlled oscillator thus supplies a local quadrature carrier which is angle-modulated, i.e. frequency or phase-modulated with the auxiliary pilot.

Oscillator radiation and other parasitic crosstalk effects now have the result that the last-mentioned angle-modulated local quadrature carrier occurs with a crosstalk-dependent amplitude at the RF input of the receiver. These angle-modulated parasitic oscillator signals are multiplied in the phase detector by the original angle-modulated local quadrature carrier of the controlled oscillator, resulting in an unwanted parasitic dc product having an amplitude which varies with the extent of oscillator radiation and crosstalk. The information about the phase and amplitude transfer of the closed loop is, however, conveyed by the auxiliary pilot at the output of the phase detector and is therefore frequency-separated from the unwanted parasitic dc product.

By detecting the return pilot, which occurs at the detection point in the signal path between the output of the phase detector and the control input of the controlled oscillator, said information about the phase and amplitude transfer of the closed loop becomes available in the form of an amplitude-varying, desired dc signal which is entirely free from said unwanted parasitic dc product. This desired dc signal varies accurately with the phase and amplitude transfer of the closed loop and hence with any quantity which gives rise to a variation of the phase and amplitude transfer of the closed loop. Consequently, the automatic gain control obtained by means of this desired dc signal not only stabilizes the loop against variations of the RF input carrier but also against said static phase errors and an accurate and substantially constant phase synchronization between the local and the RF input carrier is obtained with this loop over a dynamic range and for frequencies of the RF input carrier, which range is considerably larger and which frequencies may be considerably higher than those of the known AM PLL synchronous receiver.

Said injection point is preferably located between the detection point and the control input of the controlled oscillator and such a receiver according to the invention is characterized in that an adder circuit is arranged between the controlled amplifier and the control input of the controlled oscillator for adding the output signal of the controlled amplifier to the local auxiliary pilot, an output of the controlled amplifier being connected to the first input of the pilot detector.

Another preferred embodiment is characterized in that a peak detector is arranged between the output and the control input of the controlled amplifier, which peak detector is activated from an in-lock detector outside the locking range of the PLL.

When this measure is used, the capturing behavior of the phase-locked loop can be improved.

In a further preferred embodiment a phase shifting circuit is incorporated in one of the two input signal paths of the pilot detector.

When this measure is used, the stabilization of the loop gain can be further improved by correctly adjusting the phase shift of the phase shifting circuit.

If the frequency of the auxiliary pilot is chosen to be within the 3 dB bandwidth of the PLL, the last-mentioned embodiment is preferably characterized in that the signal applied by the phase shifting circuit to one of the two first and second inputs of the pilot detector at the frequency of the auxiliary pilot differs 90° in phase from the signal applied to the other input of the pilot detector.

When this measure is used, the pilot detector mainly functions as a phase detector and the gain control signal substantially varies with variations in the phase transfer characteristic of the PLL. This provides the possibility of an optimum gain control adjustment.

A further preferred embodiment is characterized in that the pilot detector supplies an output signal current to said selection device which comprises a parallel circuit of an integration capacitance and a reference current source via which the pilot detector is coupled to the control input of the controlled amplifier.

An extra degree of freedom for a further optimization of the gain control loop adjustment is obtained with the reference current source.

An embodiment of the receiver according to the invention as an FM stereo receiver is preferably characterized in that said signal generator includes a further controlled oscillator which is incorporated in a further phase-locked loop of a stereo decoding circuit for decoding a stereo multiplex signal comprising a stereo sum signal, a stereo difference signal modulated on a 38 kHz stereo subcarrier and a 19 kHz stereo pilot signal, said further controlled oscillator supplying an oscillator signal from which the local auxiliary pilot is derived, said local auxiliary pilot having a frequency which is an integral number of times the frequency of the stereo pilot signal.

When this measure is used, the oscillator signal of the further controlled oscillator, which serves for regenerating the stereo subcarrier in the stereo decoder, can also be used as a local auxiliary pilot for the loop gain stabilization.

BRIEF DESCRIPTION OF THE DRAWING

The invention will be described in greater detail with reference to the Figures shown in the drawing in which corresponding elements have the same reference designations.

In this drawing.

DESCRIPTION OF THE PREFERRED EMBODIMENTS

Figure 1:
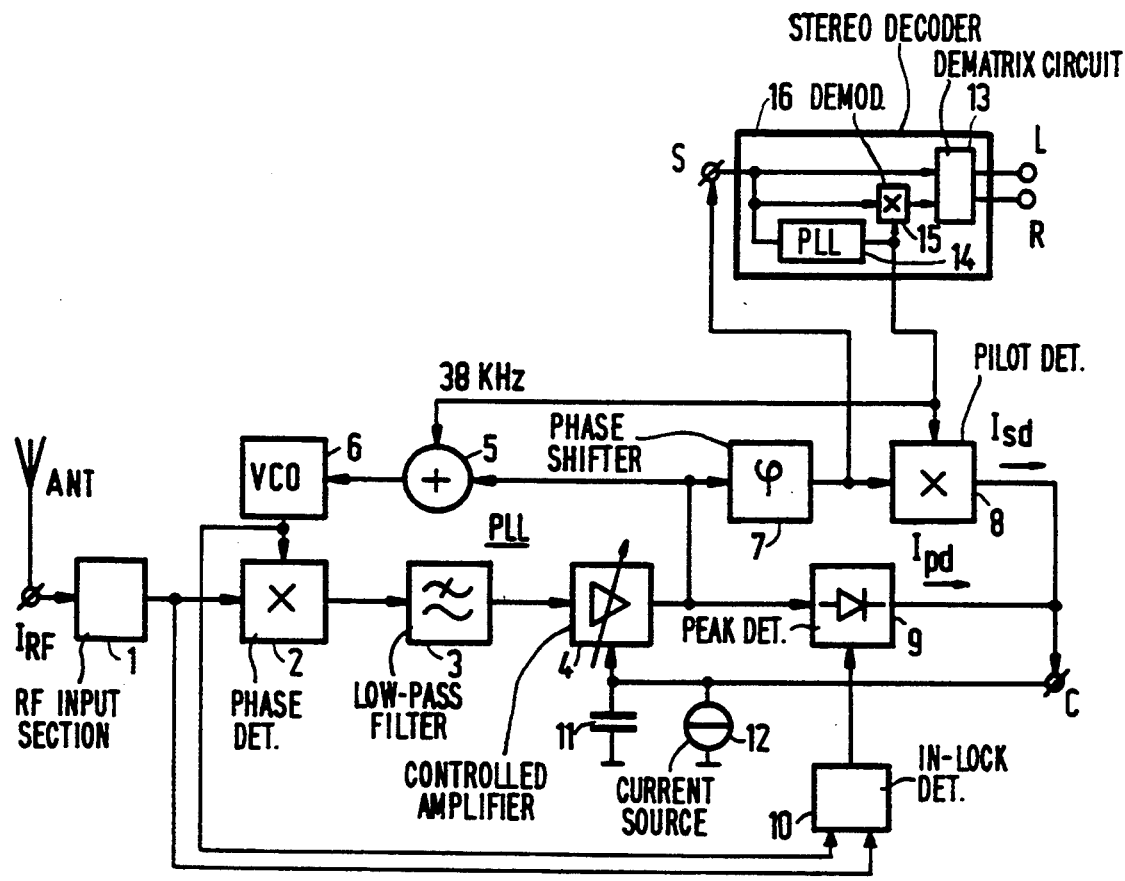
FIG. 1 shows an FM PLL synchronous receiver according to the invention.

FIG. 1 shows an FM PLL synchronous receiver according to the invention, which has a radio-frequency antenna input IRF for coupling a radio-frequency antenna device ANT thereto, which radio-frequency antenna input IRF is coupled to a phase detector 2 of a phase-locked loop PLL via a radio-frequency input section 1. The phase-locked loop PLL also comprises a loop filter 3, a controlled amplifier 4, an adder circuit 5 and a controlled oscillator 6 which are successively coupled to the phase detector 2. The controlled oscillator 6 applies a local quadrature carrier to the phase detector 2 and is tunable in frequency by means (not shown) which may be similar to the tuning means in conventional FM receivers.

A radio-frequency (RF) FM reception frequency range received by means of the antenna device ANT is applied to the phase detector 2 after wideband selection and amplification in the RF input section 1. Tuning to a desired RF reception signal in said RF FM reception frequency range is realized by choosing the frequency of the local quadrature carrier at a value which deviates from the carrier frequency of said desired RF reception signal at most over the capture range of the phase-locked loop PLL. The phase detector 2 supplies a phase difference signal which is dependent on the phase difference deviating from 90° between the local quadrature carrier and the RF carrier of the desired RF reception signal. This phase difference signal is selected in the loop filter 3 whereafter a controlled amplification of this phase difference signal is realized in the manner described hereinafter in the controlled amplifier 4.

The controlled amplifier 4 applies the phase difference signal to a control input of the controlled oscillator 6 via the adder circuit 5. In the phase-locked state of the loop PLL, the phase difference signal controls the controlled oscillator 6 in such a way that a negative feedback and hence an effective suppression of the phase differences deviating from 90° between the local quadrature carder and the RF carrier of the RF reception signal from the output to the inputs of the phase detector 2 is obtained in the loop. Consequently, a phase synchronization is obtained at which the local quadrature carrier follows the RF carrier accurately in frequency and differs 90° in phase therefrom. The phase difference signal then varies with the baseband modulation signal of the desired RF reception signal. The demodulated baseband modulation signal thus obtained is coupled out by means of a phase shifting circuit 7, which also acts as a low-pass filter, which is coupled to an output of the controlled amplifier 4.

When an RF FM stereo signal is received, the baseband modulation signal selected by the phase shifting circuit 7 comprises a baseband stereo multiplex signal with a stereo sum signal L+R in a frequency range between 0 and 15 kHz, a 19 kHz stereo pilot and a stereo difference signal L-R double sideband amplitude-modulated on a suppressed 38 kHz stereo subcarrier in a frequency range between 23 and 53 kHz. This baseband stereo multiplex signal is applied to a stereo decoder 16 which may be, for example, of the Philips type TEA 5581 and in which the baseband stereo multiplex signal is decoded in known manner into baseband left and right stereo signals L and R, respectively.

To this end the stereo decoder 16 comprises a phase-locked loop 14, a synchronous stereo difference signal demodulator 15 and a dematrixing circuit 13. The phase-locked loop 14 includes a controlled oscillator (not shown) which supplies an oscillator signal in the phase-locked state of the loop, which signal is phase-synchronous with said 19 kHz stereo pilot and whose frequency may be an integral multiple of 19 kHz, for example 38 kHz. In the embodiment shown, an 38 kHz oscillator signal is applied as a local mixing signal to the synchronous stereo difference signal demodulator 15. The baseband stereo multiplex signal whose stereo difference signal L-R modulated on the 38 kHz stereo subcarrier is demodulated to the baseband in the synchronous stereo difference signal demodulator 15 is applied to another input of the stereo difference signal demodulator 15. In the dematrixing circuit 13 the stereo sum and stereo difference signals L and R are dematrixed from the stereo sum signal L+R and the stereo difference signal L-R by means of suitable adding and subtracting operations, which signals are applied as input signals to this dematrixing circuit 13.

The controlled oscillator (not shown) of the phase-locked loop 14 also operates as a signal generator for generating a local auxiliary pilot, because it does not only supply the 38 kHz local mixing signal to the synchronous stereo difference signal demodulator 15 but also supplies it as a local 38 kHz auxiliary pilot to the control input of the controlled oscillator 6 via the adder circuit 5. This local auxiliary pilot, referred to as the original pilot, is also applied to a first input of a pilot detector 8.

The local 38 kHz auxiliary pilot is thus injected in the signal path of the phase-locked loop PLL at a point preceding the controlled oscillator 6. Consequently, the frequency of the local quadrature carrier at the output of the controlled oscillator 6 is angle-modulated (frequency or phase-modulated) with the output signal of the controlled amplifier 4 as well as with said local auxiliary pilot. The angle-modulated local quadrature carrier is mixed with the carder of the RF reception signal in the phase detector 2. In addition to the aforementioned phase difference signal, a desired mixing product is obtained at the output of the phase detector 2 at the frequency of the local auxiliary pilot with an amplitude which is not only dependent on the amplitude variations in the RF reception signal but also on possible static phase errors between the output signal of the controlled oscillator 6 and the RF input carrier. Together with said phase difference signal, this desired mixing product passes the loop filter 3 and reaches the input of the controlled amplifier 4.

The controlled amplifier 4 supplies the desired mixing product, also referred to as return pilot, to a second input of the pilot detector 8 via a phase shifting circuit 7 and to a peak detector 9. Current outputs of the peak detector 9 and the synchronous pilot detector 8 are coupled to an integrator 11 via a common control terminal C, which integrator is provided with an integration capacitance connected to ground. In the embodiment shown, an adjustable reference current source 12 is arranged in parallel across the integrator 11. An output of the integrator 11 is coupled to a gain control input of the controlled amplifier 4. The peak detector 9 operates outside the locking or hold range of the phase-locked loop PLL and is switched off when the phase-locked loop PLL reaches its phase-locked state. To this end, the peak detector 9 has a switching input which is coupled to an output of an in-lock detector 10, the in-lock detector 10 having a first input coupled to the output of the RF input section 1 and a second input coupled to the output of the controlled oscillator 6. Such an in-lock detector is known per se, for example, from Japanese Kokai publication 63-107304 or U.S. Pat. No. 4,881,042.

As is evident from the foregoing, the original auxiliary pilot is applied from the controlled oscillator (not shown) of the phase-locked loop 14 to the first input of the pilot detector 8 and the return pilot is applied from the controlled amplifier 4 to the second input via the phase shifting circuit 7. Since the frequency of the auxiliary pilot is within the 3 dB passband of the phase-locked loop PLL, variations in the loop transfer characteristic due to, for example, field strength variations and/or variations of static phase errors have a greater effect on the phase of the return pilot than on the amplitude of this return pilot. An optimum detection of the last-mentioned variations in the loop transfer characteristic is therefore obtained by measuring substantially the phase difference between the original pilot and the return pilot at the first and second inputs, respectively, of the pilot detector 8. In the embodiment shown, the pilot detector 8 is therefore provided with a multiplier circuit and the phase shift realized by the phase shifting circuit 7 is chosen with respect to the phase transfer of the loop PLL in such a way that in the phase-locked state of the loop PLL, the overall phase transfer from the input of the adder circuit 5 to the output of the phase shifting circuit 7 is substantially 90° at the frequency of the 38 kHz auxiliary pilot.

In the phase-locked state of the loop PLL, the synchronous pilot detector 8 supplies a gain control current which varies with variations in the loop transfer characteristic and hence with all quantifies resulting from the last-mentioned variations such as, for example, field strength or amplitude variations of the RF carrier applied to the phase detector 2 and static phase errors. This gain control current is integrated in the integrator 11 and converted into a gain control voltage. This gain control voltage is applied to the control input of the controlled amplifier 4 and realizes such a gain control in the loop that the variations in the loop transfer characteristic and hence phase and amplitude variations of the return pilot are compensated for. In practice, the obtained stabilization of the loop transfer properties of the phase-locked loop PLL is possible within a large input dynamic range of the receiver.

In contrast to the afore-mentioned prior art, the result of oscillator radiation is that the parasitic oscillator signals at the RF input of the phase detector 2 as well as the local quadrature career are both angle-modulated with said local 38 kHz auxiliary pilot. This causes an unwanted parasitic dc product having an amplitude which varies with the extent of oscillator radiation and crosstalk. The information about the phase and amplitude transfer of the closed loop is, however, conveyed by the return pilot and is therefore separated in frequency from the unwanted parasitic dc product. This unwanted parasitic dc product is converted in the pilot detector 8 to a frequency which corresponds to the frequency of the auxiliary pilot and is subsequently suppressed in the integrator 11. Consequently, the last-mentioned stabilization of the loop transfer properties of the phase-locked loop PLL is independent of the frequency and is effectively operative in a comparatively large RF reception range which does not only comprise the conventional AM RF broadcast frequency range but also the normal FM RF broadcast frequency range.

The above holds true in the phase-locked state of the loop. Outside the locking range or the capture range of the phase-locked loop PLL, the amplitude of the return pilot is zero or nearly zero. As a result, the output current of the synchronous pilot detector 8 outside the locking range is 0 or is at least fairly small. Consequently, the gain of the controlled amplifier 4 is set to a maximum value. To prevent this, it is possible to choose the gain of the controlled amplifier outside the locking range of the phase-locked loop PLL at a fixed reference value.

A significant increase of the input dynamic range for which the gain control loop realizes an effective stabilization of the loop gain is possible with the aid of a peak detector 9. This peak detector 9 is dimensioned in such a way that it supplies an output current which, with a suitably chosen integration constant, varies with the input voltage, while a fixed reference current is subtracted from this output current. This reference current should be chosen to be substantially equal to the output current of the peak detector 9 at an input voltage which corresponds to the signal amplitude level at the stabilization value of the loop gain. A further elucidation of the operation of such a peak detector 9 is not necessary for understanding the invention. If the range in which a frequency control occurs in the phase-locked loop is referred to as the capture range and the range in which a phase synchronization occurs in the phase-locked loop PLL is referred to as the locking range, frequency differences between the local quadrature carrier and the RF reception carrier at the phase detector 2 will be applied to the input of the peak detector 9 via the loop filter 3 and the controlled amplifier 4 in the capture range of the phase-locked loop PLL. Dependent on the amplitude of this difference frequency with respect to the stabilization level, the peak detector 9 controls the gain of the controlled amplifier 4 in such a way that the amplitude of said difference frequency is controlled at the stabilization level. In the case of a transition of said frequency control in the capture range to a phase control in the locking range, the synchronous pilot detector 8 takes over the gain control from the peak detector 9. At that instant the peak detector 9 is simultaneously switched off from the in-lock detector 10.

The frequency of the auxiliary pilot can be chosen within the 3 dB passband of the phase-locked loop PLL, but also outside it. At a frequency of the auxiliary pilot within the 3 dB loop bandwidth, an optimum adjustment of the working point of the gain control is obtained when the phase difference between the two pilots applied to the pilot detector 8 is 90°. The pilot detector 8 then functions mainly as a phase detector. To this end, the phase shift in the phase shifting circuit 7 should be adjusted to a suitable value. In a practical embodiment of the FM PLL synchronous receiver shown, in which an 38 kHz auxiliary pilot frequency was used, the phase shift of the 38 kHz return pilot in the phase shifting circuit 7 was substantially 45°. However, a different working point can be chosen with the phase shifting circuit 7.

A different manner of adjusting the working point is obtained by means of an adjustable reference current source 12 which is arranged parallel to ground across the integration capacitance 11. If the frequency of the auxiliary pilot is chosen to be within the 3 dB loop passband, said reference current source 12 can be dispensed with by suitable choice of the phase shift of the return pilot in the phase shifting circuit 7.

However, it is alternatively possible to choose the auxiliary pilot frequency far beyond the 3 dB bandpass width of the phase-locked loop PLL. In that case the pilot detector 9 should substantially function as an amplitude detector because loop transfer variations will then have a greater effect on the amplitude of the return pilot than on the phase of the return pilot. The phase difference between the two pilots applied to the pilot detector 8 should then be substantially 0° or 180° and the pilot detector 8 substantially functions as an amplitude detector. To this end, the working point of the gain control circuit is preferably substantially adjusted by means of the adjustable reference current source 12 and the phase shifting circuit 7 may be dispensed with.

It will be evident that the use of the inventive idea is not limited to the receiver shown in FIG. 1. For example, it is possible to couple the output of the controlled amplifier 4 directly to the stereo multiplex signal input S of the stereo decoder 16, to choose the auxiliary pilot frequency at a different multiple than 2 of the 19 kHz stereo pilot, to use a pilot detector 8 and/or a peak detector 9 supplying output signal voltages which are present at the control input of the controlled amplifier via a suitably chosen selection device. It is also feasible to omit the peak detector 9 and to adjust, with the aid of the in-lock detector 10, the gain of the controlled amplifier 4 to a reference value outside the locking range of the phase-locked loop PLL. It will be evident from the foregoing that, dependent on the choice of the auxiliary pilot frequency, the phase shifting circuit 7 and/or the adjustable reference current source 12 can be used for a suitable adjustment of the gain control behavior of the gain control loop 4, 7 to 12.

The receiver shown is an FM PLL synchronous receiver because the FM modulation signal is directly demodulated from the RF reception carrier to the baseband in the phase-locked loop PLL. However, the phase-locked loop PLL may be used in a superheterodyne FM receiver having an RF section 1 in which a wideband conversion of the RF FM reception frequency range to an intermediate frequency is realized, which frequency is located above the highest frequency in said RF FM reception band. In such an FM superheterodyne receiver, tuning can also be realized by means of a tuning control signal at the tuning control input of the controlled oscillator 6.

Figure 2:
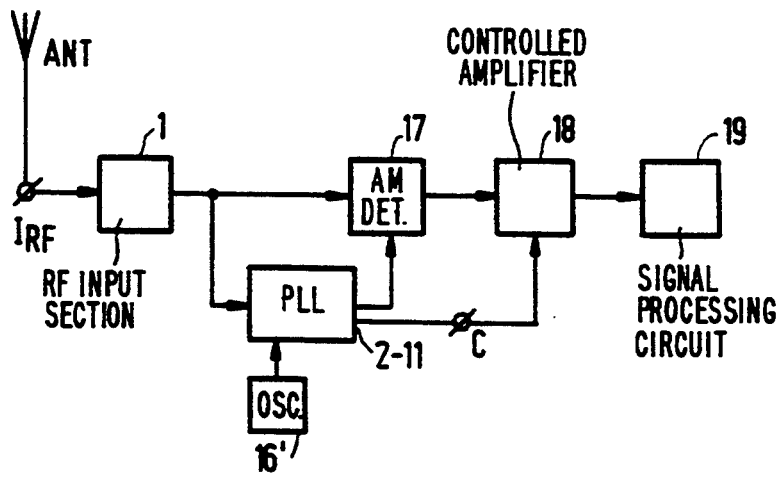
FIG. 2 shows an AM PLL synchronous receiver according to the invention.

In FIG. 2 the use of the phase-locked loop PLL shown in FIG. 1 is illustrated in an AM PLL synchronous receiver according to the invention. The elements shown therein, which are the same as the elements of the receiver of FIG. 1, have corresponding reference designations. The AM PLL synchronous receiver shown includes a synchronous AM detector 17 to which a desired radio-frequency AM reception signal is applied from the RF section 1 and a local synchronous quadrature carrier is applied from the phase-locked loop 2 to 11. This local synchronous mixing carrier is derived in known manner (not shown) by means of a 90° phase shift of the local quadrature carrier at the output of the controlled oscillator 6. The synchronous AM demodulator 17 applies the desired baseband modulation signal to a controlled amplifier 18, a control input of which is connected to the control terminal C of the phase-locked loop 2 to 11. In this controlled amplifier 18, the baseband modulation signal is amplified and stabilized at a suitable level, whereafter the baseband modulation signal is further processed and reproduced in known manner in a baseband signal processing circuit 19. For generating the auxiliary pilot, a local oscillator 16' having a fixed frequency is used in the embodiment of FIG. 2, for which, for example, a crystal oscillator can be used which has an output coupled to the adder circuit 5 and to the synchronous pilot detector 8.

The auxiliary pilot frequency of the oscillator 16' is preferably chosen to be within the passband of the phase-locked loop 2 to 11. For use in an AM PLL radio synchronous receiver, this frequency is at most several hundred Hz. In a practical embodiment of such an AM PLL radio synchronous receiver, a frequency in the sub-audio band was chosen for the auxiliary pilot frequency.

It will not be difficult to those skilled in the art to use the inventive idea in a television receiver and, for example, in a line oscillator incorporated in a PLL for generating the auxiliary pilot.

I claim:

1. A receiver having a radio frequency (RF) input section for receiving an RF input signal; a phase-locked loop coupled to an output of said RF input section, said phase-locked loop having a signal path incorporating a phase detector, a loop filter, a controlled amplifier and a controlled oscillator, said phase detector having a first input coupled to the output of said RF input section, and an output coupled to an input of said loop filter, an output of said loop filter being coupled to an input of said controlled amplifier, an output of said controlled amplifier being coupled to a control input of said controlled oscillator, and an output of said controlled oscillator being coupled to a second input of said phase detector; a signal generator for generating a local auxiliary pilot; and a pilot detector for detecting the local auxiliary pilot, a first input of said pilot detector being coupled to the signal path of the phase-locked loop between an output of the controlled amplifier and the control input of the controlled oscillator, a second input of said pilot detector being coupled to an output of the signal generator, and an output of said pilot detector being coupled to a control input of the controlled amplifier via a selection device, said selection device converting the output from said pilot detector to a gain control voltage for said controlled amplifier, wherein the output of the signal generator is also coupled to the signal path between the output of the controlled amplifier and the control input of the controlled oscillator which causes an output signal of the controlled oscillator to be angle modulated with the local auxiliary pilot.

2. A receiver as claimed in claim 1, wherein an adder circuit is arranged between the controlled amplifier and the control input of the controlled oscillator for adding the output signal of the controlled amplifier to the local auxiliary pilot, an output of the controlled amplifier being connected to the first input of the pilot detector.

3. A receiver as claimed in claim 1, wherein a phase shifting circuit is incorporated in a signal path to the first input of the pilot detector.

4. A receiver as claimed in claim 1, wherein a peak detector is arranged between the output of the controlled amplifier and the control input of the controlled amplifier, said peak detector stabilizing the gain of said controlled amplifier and being activated by an in-lock detector having inputs connected to the output of the controlled oscillator and to an output of said RF input section, said in-lock detector detecting when a received RF signal is outside the locking range of the phase-locked loop.

5. A receiver as claimed in claim 3, wherein the phase-locked loop has a 3 dB passband and the frequency of the auxiliary pilot is smaller than the 3 dB passband of the phase-locked loop, and the signal applied by the phase shifting circuit to the first input of the pilot detector at the frequency of the local auxiliary pilot differs by substantially 90° in phase from the signal applied to the second input of the pilot detector.

6. A receiver as claimed in claim 1, wherein the pilot detector supplies an output signal current to said selection device which comprises a parallel circuit of an integration capacitance and a reference current source, said parallel circuit coupling the pilot detector to the control input of the controlled amplifier.

7. A receiver as claimed in claim 4, wherein the peak detector supplies an output signal current to said selection device which comprises a parallel circuit of an integration capacitance and a reference current source, said parallel circuit coupling the peak detector to the control input of the controlled amplifier.

8. A receiver as claimed in claim 1, wherein said RF input signal comprises a stereo multiplex signal and said signal generator includes an input coupled to the output of said controlled amplifier, said signal generator comprising a stereo decoding circuit coupled to the input of said signal generator for decoding the stereo multiplex signal which includes a stereo sum signal, a stereo difference signal modulated on a 38 kHz stereo subcarrier and a 19 kHz stereo pilot signal, said stereo decoding circuit including an additional phase-locked loop having an additional controlled oscillator incorporated in a signal path of said additional phase-locked loop, said additional controlled oscillator supplying an oscillator signal from which the local auxiliary pilot is derived, said local auxiliary pilot having a frequency which is an integral number of times the frequency of the stereo pilot signal.

9. A receiver as claimed in claim 2, wherein a phase shifting circuit is incorporated in a signal path to the first and second input of the pilot detector.

10. A receiver as claimed in claim 2, wherein a peak detector is arranged between an output of the controlled amplifier and the control input of the controlled amplifier, said peak detector stabilizing the gain if said controlled amplifier and being activated by an in-lock detector having inputs connected to the output of the controlled oscillator and to an output of said RF input section, said in-lock detector detecting when a received RF signal is outside the locking range of the phase-locked loop.

11. A receiver as claimed in claim 3, wherein a peak detector is arranged between an output of the controlled amplifier and the control input of the controlled amplifier, said peak detector stabilizing the gain if said controlled amplifier and being activated by an in-lock detector having inputs connected to the output of the controlled oscillator and to an output of said RF input section, said in-lock detector detecting when a received RF signal is outside the locking range of the phase-locked loop.

12. A receiver as claimed in claim 9, wherein a peak detector is arranged between an output of the controlled amplifier and the control input of the controlled amplifier, said peak detector stabilizing the gain if said controlled amplifier and being activated by an in-lock detector having inputs connected to the output of the controlled oscillator and to an output of said RF input section, said in-lock detector detecting when a received RF signal is outside the locking range of the phase-locked loop.

13. A receiver as claimed in claim 10, wherein the peak detector supplies an output signal current to said selection device which comprises a parallel circuit of an integration capacitance and a reference current source, said parallel circuit coupling the peak detector to the control input of the controlled amplifier.

14. A receiver as claimed in claim 11, wherein the peak detector supplies an output signal current to said selection device which comprises a parallel circuit of an integration capacitance and a reference current source, said parallel circuit coupling the peak detector to the control input of the controlled amplifier.

15. A receiver as claimed in claim 12, wherein the peak detector supplies an output signal current to said selection device which comprises a parallel circuit of an integration capacitance and a reference current source, said parallel circuit coupling the peak detector to the control input of the controlled amplifier.

* * * * *